United States Patent
Arnold et al.

(10) Patent No.: US 6,909,615 B2
(45) Date of Patent: Jun. 21, 2005

(54) EQUIPMENT AND METHODS FOR PRODUCING CONTINUOUS METALLIZED THERMOFORMABLE EMI SHIELDING MATERIAL

(75) Inventors: Rocky R. Arnold, San Carlos, CA (US); John C. Zarganis, Redwood City, CA (US)

(73) Assignee: Wavezero, Inc., Sunnyvale, CA (US)

( * ) Notice: Subject to any disclaimer, the term of this patent is extended or adjusted under 35 U.S.C. 154(b) by 0 days.

(21) Appl. No.: 10/664,838

(22) Filed: Sep. 17, 2003

(65) Prior Publication Data

US 2004/0120131 A1 Jun. 24, 2004

Related U.S. Application Data

(60) Provisional application No. 60/411,104, filed on Sep. 17, 2002.

(51) Int. Cl.$^7$ .............................................. H05K 9/00
(52) U.S. Cl. ...................... 361/818; 361/800; 361/816; 174/35 R; 174/35 GC; 174/35 MS
(58) Field of Search ................................ 361/800, 816, 361/818; 174/35 R, 35 GC, 35 MS, 32

(56) References Cited

U.S. PATENT DOCUMENTS

| | | | |
|---|---|---|---|
| 3,620,872 A | | 11/1971 | Backwell |
| 4,329,196 A | | 5/1982 | Rawlinson |
| 4,423,106 A | | 12/1983 | Mahn |
| 4,824,506 A | | 4/1989 | Hoerner et al. |
| 4,896,001 A | * | 1/1990 | Pitts et al. ............. 174/35 MS |
| 4,913,760 A | | 4/1990 | Benson et al. |
| 5,286,528 A | | 2/1994 | Reafler |
| 5,318,855 A | * | 6/1994 | Glovatsky et al. .......... 428/457 |
| 5,395,659 A | | 3/1995 | Gräf et al. |
| 5,538,576 A | | 7/1996 | Knop et al. |
| 5,557,064 A | * | 9/1996 | Isern-Flecha et al. .. 174/35 MS |
| 5,811,050 A | | 9/1998 | Gabower et al. |
| 5,945,059 A | | 8/1999 | Atake |
| 6,206,998 B1 | | 3/2001 | Niazy |
| 6,359,213 B1 | * | 3/2002 | Long ........................ 174/35 R |
| 6,377,475 B1 | | 4/2002 | Reis |
| 6,455,770 B2 | * | 9/2002 | Pulver ................... 174/35 MS |
| 6,470,650 B1 | | 10/2002 | Lohwasser |
| 6,483,719 B1 | | 11/2002 | Bachman |
| 6,604,281 B2 | * | 8/2003 | Shiau .......................... 29/840 |
| 6,624,432 B1 | * | 9/2003 | Gabower et al. ........ 250/515.1 |
| 6,643,918 B2 | | 11/2003 | Ortiz et al. |
| 6,652,777 B2 | * | 11/2003 | Rapp et al. ................. 252/511 |
| 6,674,652 B2 | * | 1/2004 | Forte et al. ................. 361/800 |
| 6,768,654 B2 | | 7/2004 | Arnold et al. |
| 6,804,121 B2 | * | 10/2004 | Fischbach et al. .......... 361/752 |
| 2001/0028558 A1 | | 10/2001 | Rapp et al. |
| 2001/0033478 A1 | | 10/2001 | Ortiz et al. |

OTHER PUBLICATIONS

Li/Lyle Industries, "Where Ideas Take Shape," product information.

Adams; *Taking the Mystery Out of Metallizing,* Vacuum Technology (Nov. 1975) Technical Publishing Company, 4 pages total.

Adams; *Taking the Mystery Out of Metallizing–II,* Vacuum Technology (Dec. 1975) Technical Publishing Company, 3 pages total.

(Continued)

*Primary Examiner*—Randy W. Gibson
*Assistant Examiner*—Dameon E. Levi
(74) *Attorney, Agent, or Firm*—Townsend and Townsend and Crew LLP

(57) ABSTRACT

The present invention provides in-line equipment and methods for manufacturing an EMI/RFI shield that is integrated formed in a formable sheet. The EMI/RFI shield may comprise a shaped thermoform shell that has one or more conductive layers applied to one or more surfaces. The EMI/RFI shield may be integrally formed with the formable sheet via attachment tabs that are positioned along one or more edges of the EMI/RFI shield.

28 Claims, 6 Drawing Sheets

OTHER PUBLICATIONS

Adams; *Taking the Mystery Out of Metallizing–III,* Vacuum Technology (Feb. 1976) Technical Publishing Company, 4 pages total.

Gabower, *Thermoformed Vacuum–Metallized Inserts For EMI Shielding,* ITEM (1995) The International Journal of EMC, Robar Industries, Inc., pp. 120, 122, 123, and 127.

Gabower, *Thermoformed Vacuum Metallized Inserts For EMI Shielding of Electronic Devices,* Consumer Electronics Show, Flamingo Hilton and Tower, Las Vegas, Nevada, pp. 151–158.

Gwinner, *Vacuum Evaporated Aluminum for Selective Shielding of Plastic Housings,* ITEM (1993) The International Journal of EMC, Robar Industries, Inc., pp. 138, 140, 290, 292, 294, and 296.

Hasler, *Electroplating and Vacuum Metalizing,* Galvanotechnic (1984) vol. 2, 5 pages total.

Kimmel et al., *Shielding for EMI control . . . and how to do it right,* EDN (Jan. 20, 1994) pp. S59–S69.

Leonard, *What's Hot and What's Not in EMI Shielding of Plastics,* Plastics Design Forum (Mar./Apr. 1993) pp. 32–35.

Smock, *Trend to Lower Cost Resins Will Accelerate,* Plastics World (Apr. 1995) 1 page total.

Rigney, *Vacuum Coating,* pp. 387–388, 390–410.

Chomerics, Inc., *EMI Shielding for Commercial Electronics* (1994) pp. 4–5, 30–33.

Concise Encyclopedia of Polymer Science & Engineering, John Wiley & Sons, (1990) ISBN 0–471–51253–2, pp. 446–746, 1192–1195.

Holland, *Degassing of Plastic Materials/Plasticizers,* Vacuum Deposition of Thin Films, Chapman & Hall Ltd., London (1996) pp. 46–47, 52–53.

*EMI Protection in Consumer Portable Products,* Electronic Packaging and Production (Mar. 1994) pp. 40–44.

Grerg et al., *Machinery's Handbook, ,* Industrial Press, New York (1976) pp. 2299–2301.

*EMI/REI Shielding Guide,* General Electric Plastics Co. pp. 1–50.

*Vacuum Metallizing Electrical Problems,* TIPS, Midwest Tungsten Service (1986) 2 pages total.

*6100 Thermoformable EMI–Shielding Material,* Minnesota Mining & Mfg. Co. (1994) 2 pages total.

*Orion® Designs Economical EMI Shielding Box Without Cutting Corners,* Product Brochure, Orion® Industries Incorporated, 1 page total.

*New Solutions for the Electronic Age,* Placon Corp., Madison, Wisconsin, Sales Brochure, 1 page total.

*Silver–Coated VALOX FR–1 Film Provides Shielding For Circuit Breakers,* GE Films in Action (Jun. 1994) General Electric Co., 1 page total.

*Style CBS Circuit Board Component Shielding—Design Guide 4,* Product Brochure, Leader Tech., Tampa, Florida, 2 pages total.

*Ultrasonic Welders Advance Clamshell–Sealing Process,* Packaging (Oct. 1994) pp. 78–21.

Vacuum Platers, Inc. (VPI), Product Brochure, 4 pages total.

*EMI/RFI Products* EE–Evaluation Engineering (Apr. 1995) pp. 64.

*Silver Shielding for the Highest Performance,* Swift Textile Metalizing Corporation, ITEM (1995) pp. 11, 15, 109, 112, 113, 115, 116, 212, 213, 267, 269.

\* cited by examiner

Section A-A

US 6,909,615 B2

EQUIPMENT AND METHODS FOR PRODUCING CONTINUOUS METALLIZED THERMOFORMABLE EMI SHIELDING MATERIAL

CROSS-REFERENCES TO RELATED APPLICATIONS

The present application claims benefit to provisional patent application Ser. No. 60/411,104, filed on Sep. 17, 2002, entitled "Equipment for Producing Continuous Metalized Thermoformable EMI shielding Material for Tape & Reel Applications," the complete disclosure of which is incorporated herein by reference.

BACKGROUND OF THE INVENTION

The present invention relates generally to methods and devices for in-line processing of a substrate. More specifically, the present invention relates to in-line methods of producing a metallized, shaped product on a sheet, for use in tape and reel applications.

Production of thermoformed pieces (e.g., small boxes to hold screws, packaging for consumer products, etc.) often relies upon the use of "in-line" processing equipment. In a typical application, a roll of polymer based material (such as PVC, polyester, etc.) is removed from a spool that has a standard width, generally between 10" and 42" and the sheet is pulled into a series of connected, but independent, equipment or stations that modify the polymer sheet sequentially to form the final piece.

Specifically, after the material is unspooled and heated to the required processing temperature, the material is thermoformed or otherwise shaped. If thermoformed, the polymer based material is heated (or cooled) to a target processing temperature (usually between 250° F. and 375° F., depending upon the polymer and subsequent processing steps). The polymer based material may then enter a processing station in which hard (e.g., aluminum, steel or ceramic) tooling may be used to shape the polymer-based material. Heat, in addition to vacuum, pressure, or mechanical molding, may be used to achieve the desired shape of the product. The metal or ceramic tooling often involves both dies and molds to achieve the required shape and mechanical details. This processing involves high pressures but is rapidly accomplished, e.g., a matter of seconds. In a subsequent step, the polymer based material may be pulled through to another station that cuts the final part away from the remaining material of the sheet.

While conventional methods of shaping and processing polymer-based sheets have been effective, there remains a need for methods and equipment that produce thermoformed products in a cost and time effective in-line process. In particular, there remains a need to produce metallized thermoformed products in an in-line process.

BRIEF SUMMARY OF THE INVENTION

The present invention provides in-line processing equipment and methods for in-line processing of a substrate. The present invention also provides novel stations for in-line plastic processing equipment and products (such as an EMI/RFI shield) that are integrally attached to a sheet.

The in-line equipment of the present invention may include some combinations of stations to heat, shape (e.g., thermoform), apply one or more conductive or nonconductive layers, apply conductive or non-conductive gasketing material, and/or die cut. Advantageously, it would then be possible to accept at one end of the in-line equipment, a rolled flat polymer-based sheet (e.g., polycarbonate, ABS, PVC, PBT etc.) and conduct a continuous chain of operations (e.g., in-line) that result in the efficient production of a complete product that is integrally assembled into a "tape" structure that is ready for final assembly using standard robotic component placement equipment or manual processing methods.

By connecting all of these processes into an in-line process, the present invention provides an economical manufacturing process, in the sense that, at one end, raw material (e.g., a formable sheet) is input into the equipment and at the output, a final product, such as an EMI/RFI shield is created. This in-line processing lowers the overall cost of production of the EMI shield and is suitable for global manufacturing operations as practiced by participants in the electronics manufacturing sector (EMS).

In one aspect, the present invention provides an EMI/RFI shield integrally formed in a formable sheet, such as a thermoformable sheet. Portions of the thermoformable sheet are removed around a periphery of the EMI/RFI shield. The portions of the thermoformable sheet that are not removed are used to integrally connect the EMI/RFI shield to a remainder of the thermoformable sheet. The EMI/RFI shield that is integral with the sheet may be manufactured by any of the methods and in-line equipment described herein.

The EMI/RFI shield may comprise at least one layer of a conductive material, such as tin, aluminum, copper, and nickel. The EMI/RFI shield may have a plurality of conductive layers of the same or different materials. For example, the EMI/RFI shield may have a vacuum metallized first layer of nickel and a electroplated second layer of tin or nickel.

The thermoformable sheet used to form the EMI/RFI shield may be made from a virgin polymer (such as polypropylene, polycarbonate, ABS, PVC, PBT, or the like) or it may be composed of a recycled, conductively coated polymer EMI/RFI shield that has been mechanically disintegrated and then recombined back into the formable polymer sheet. The recycled EMI/RFI shield may have been metallized with a painted film, a vacuum metallized film, an electroless plated film, or the like.

The EMI/RFI shield may be a single compartment shield or it may be multi-compartmentalized. In one embodiment, the EMI/RFI shield defines a top surface, a plurality of sidewalls extending at an angle from the top surface and a flange around a periphery of the side walls that extend at an angel from the side walls. Typically, the flange and the top surface define substantially parallel planes.

In a further aspect, the present invention provides a reel of material for in-line processing equipment. The reel comprises a spool that receives a sheet of material. A plurality of EMI/RFI shields are attached to the sheet of material that is rolled on the spool. The EMI/RFI shields may be integrally attached to the sheet of material with tabs of material. Typically, the EMI/RFI shields have at least one conductive layer applied thereon. The thermoformable sheet used to form the EMI/RFI shield may be made from a virgin polymer (such as polypropylene, polycarbonate, ABS, PVC, PBT, or the like) or it may be composed of a recycled, conductively coated polymer EMI/RFI shield that has been mechanically disintegrated and then recombined back into the formable polymer sheet. The recycled EMI/RFI shield may have been metallized with a painted film, a vacuum metallized film, an electroless plated film, or the like.

In another aspect, the present invention provides in-line processing equipment for continuously processing a formable sheet. In one embodiment, the processing equipment comprises at least one metallization station that metallizes at least one surface of the formable sheet. One or more shaping stations, such as a thermoforming station, are positioned before or after the metallization station in the line to shape the formable sheet into a shaped product. At least one cutting station is configured to partially remove material around at least a periphery of the shaped, metallized product so that the product remains on the sheet. A transportation assembly moves the formable sheet between stations.

The in-line processing equipment may optionally include a gasketing station that applies a gasket to the shaped, metallized product. The gasket is typically in the form of an electrically conductive or electrically insulative adhesive. The gasketing station may comprises a screen printing assembly to deliver the pattern of adhesive to one or more surfaces of the product. Optionally, the adhesive gasket may be in the form of a prefabricated gasket that is in a predetermined shape that matches certain features of the shaped product. The adhesive may include a removable protective liner on an inner and/or outer surface of the adhesive.

The cutting station may comprise one or more platens or rotating cutting members that cut the sheet at selected locations around the product so as to remove only a portion of the material around the periphery of the shaped, metallized product. The cutting station may be configured to leave tabs of material along one or more edges of the shaped product so that the product remains intact on the original sheet. Consequently, the entire sheet (with the attached products) may be moved (either in-line or transported as a rolled up sheet on a spool) to a final processing station, where the product may be removed from the sheet and placed on the final assembly (e.g., PCB or electronic device, such as a cellular telephone).

The metallization station may take on a variety of forms. For example, the metallization station may apply a metal or other conductive layer via painting, ion deposition, sputtering, electroplating, vacuum metallization, ink printing (with a conductive ink), arc plasma, or other conventional metallization methods. Moreover, instead of a metal layer, the metallization station may actually deposit a non-conductive or non-metal layer that comprises conductive material, such as conductive fibers, conductive particles, or the like.

In some embodiments, the in-line equipment may comprise a plurality of metallization stations that deposit a plurality of different metal layers. For example, a first metallization station may deposit a first metal layer (e.g., a vacuum deposited layer of metal, such as nickel) over at least one surface of the sheet. A second metallization station may deposit a second metal layer over the first metal layer (e.g., electroplate a layer of metal, such as tin or nickel over the aluminum first layer). As can be appreciated, the first metal layer and second metal layer may directly contact each other, or an intermediate conductive or non-conductive may be disposed between the first and second metal layers.

In one embodiment, the metallization station comprises a chamber with a top and bottom section. The top and bottom sections are moveable between an open position which allows a finite length of sheet to enter the chamber, and a closed position in which the top and bottom sections or ports of the sections contact the sheet to create a pneumatic seal around the finite length of sheet. The chamber may include a metallization source for depositing a metal material onto the portion of the sheet in the metallization chamber. The chamber may be configured to evacuate the chamber of air to a vacuum level sufficient for thermally evaporating metal onto the finite length of sheet in the chamber. Typically, the evacuation time will have a comparable cycle time (typically between approximately 3 seconds and approximately 5 minutes) to the shaping and cutting stations so as to maintain a consistent feed of the sheet through the in-line processing equipment. The metallization station may optionally be configured to rotate and/or flex the finite length of sheet inside the chamber during metallization to ensure all surfaces of the sheet and/or product are substantially evenly metallized.

The metallization station may comprise an assembly that automatically replenishes the metal evaporated during metallization. The metal is typically supplied on a continuous fed spool or as small pieces of metal that are inserted into heating filaments within the chamber.

The in-line processing equipment may include a reel station that reels the sheet comprising the shaped, metallized product onto a reel or spool. The reel may then be transported (with the shaped, metallized products still attached) to a remote site or to another in-line processing station on-site, where the shaped, metallized products may be unrolled and assembled onto a final product or electronic device.

The shaped, metallized products may be an EMI/RFI shields (e.g., single chamber shield or multi-compartmentalized shields) that are transported to a final manufacturing station and the tabs of material may be cut to remove the EMI/RFI shield from the sheet and placed manually or robotically onto a printed circuit board of an electronic device, such as a cellular phone.

The final products may be further be processed at the cutting station (or at a second cutting station in the in-line processing equipment) so as to remove material from desired locations in the shaped, metallized product or from the sheet prior to processing, so as to allow ventilation through the final product. Alternatively, the material may be removed from the product so as to allow items, such as flexible circuitry, cables, connectors, heat sinks or tools, to have clearance to pass through the product.

The in-line equipment may further comprise a second cutting station that removes the shaped, metallized product from the sheet. Typically, the second cutting station will be present in equipment which manufacture and place the product onto its final product in a single in-line process. In such embodiments, the in-line equipment may also include a station that places the product on the final product. For example, if the product is an EMI/RFI shield, the station may move the shield from the sheet (e.g., cut the tabs of material) and robotically or manually allow the shield to be placed over an EMI/RFI source on a printed circuit board (PCB) of an electronic device.

It should be appreciated that the stations may be positioned in different areas of the in-line processing equipment. For example, it may be desirable to shape the sheet prior to metallization and cutting. In other embodiments, it may be desirable to metallize the sheet prior to shaping and cutting the sheet. In yet further embodiments, it may be desirable to shape and cut the sheet prior to metallization. Any desired configuration between the stations or even multiple stations of the same type may be used.

The sheet for use in the in-line equipment may be a pre-manufactured, polymer based material, such as polypropylene, polycarbonate, ABS, PVC, PBT, or the like, that is rolled out of a reel and fed into the stations in an in-line process. The flat polymer-based sheet is either metallized or may contain metallized inclusions and characteristics. For example, such sheets include substrates that have been impregnated with metals or conductive materials either by straight inclusion of the particles during the sheet fabrication, or by regrinding and recycling previously metallized substrates and re-extruding the regrind into new thermoformable sheets that contain metallized particles.

Instead of unspooling a pre-manufactured roll of material, in some embodiments, the in-line equipment may include a forming station, such as an in-line extruder, that forms the polymer sheet. The sheet may be formed from virgin polymer material or used material, including material that may already contain metallized particles or layers (such as carbon, ferrites, metallized glass fibers, metallized fibers, nano-particles, or even surface metallizations of product earlier manufactured by one of several processes including vacuum metallization, electroplating conductive painting or the like).

Optionally, the in-line equipment may include a graphics station that prepares a surface of the formable sheet by applying text or graphics. The graphics station may apply the text or graphics via silk-screening, printing, laser printing, decal with adhesive backings, or the like. The graphics station may apply the text or graphics in its final form or in a form that achieves its final desired appearance when the text or graphics are distorted during shaping. The text or graphics may be placed on top of the conductive layer or applied such that the text or graphics are visible through the conductive layer.

In one specific configuration, the present invention provides an in-line processing system that comprises a shaping station that shapes a product shape into the formable sheet, a metallization station that applies a conductive layer onto at least one surface of the sheet, and a transportation assembly that is used to transport the sheet (and product) between the stations.

In yet another specific configuration, the present invention provides an in-line processing system that comprises a shaping station that shapes the formable sheet, a gasketing station that applies a gasket to the shaped product on the sheet, and a transportation assembly that moves the formable sheet (and product) between the stations.

In a further configuration, the present invention provides an in-line processing system that comprises a shaping station that shapes the formable sheet, a cutting station that removes only a portion of material around a periphery of a product on the sheet so as to leave the product integrally attached with the sheet, and a transportation assembly that moves the formable sheet (and product) between the stations.

In another aspect, the present invention provides continuous in-line methods of processing a formable sheet. In one embodiment, the method comprises applying at least one conductive layer to at least one surface of the formable sheet. The formable sheet is shaped (e.g., thermoformed) into a desired product. At least a portion of the material around a periphery of the product so is removed so as to leave the product on the sheet. Removing only a portion of the material around a periphery of the product allows the product to remain attached to the sheet while providing for easier removal of the product from the sheet at a subsequent processing station. Optionally, the sheet may thereafter be wound onto a reel.

The metallization may occur before shaping of the sheet, or the metallization may occur after the shaping of the sheet. The cutting may occur after shaping and before applying of the conductive layer. Alternatively, the cutting may be carried out after shaping and after applying of the conductive layer. As can be appreciated, any sequence of applying the conductive layer, shaping, and cutting may be used in the methods and equipment of the present invention.

A gasket may be applied onto at least one surface of the product. The gasket may be an electrically conductive or electrically insulative adhesive. The adhesive may be prefabricated into a desired shape and may have a protective liner on its outer surface.

The formable sheet may be manufactured by extruding a material substrate. The material substrate may be a virgin or used polymer based material. The polymer based material may include a conductive layer or conductive particles (such as carbon, ferrites, metallized glass fibers, metallized fibers and/or nano-particles, or even surface metallization of product earlier manufactured by one of several processes including vacuum metallization, electroplating conductive painting or the like) such that conductive particles will be dispersed in at least a portion of the resultant formable sheet.

Optionally, a surface of the formable sheet may be prepared by applying text or graphics to at least one surface of the sheet. The text or graphics may be applied via silk-screening, printing, laser printing, as a decal with adhesive backings, or the like. The text or graphics may be applied in its final form or in a form that achieves it final desired appearance when the text or graphics are distorted during shaping. The text or graphics may be placed on top of the metal conductive layer or applied such that the text or graphics are visible through the conductive layer.

In addition to removing material around the periphery of the product, material may be removed from the product at desired locations to provide ventilation or to provide clearance for other items to extend through the final product.

These and other aspects of the invention will become more apparent from the following detailed description of the invention when taken in conjunction with the accompanying drawings.

DETAILED DESCRIPTION OF THE INVENTION

While the remainder of the discussion focuses on EMI/RFI shields and in-line processing of the EMI/RFI shield, it should be appreciated that the equipment, methods, and products of the present invention are not limited to EMI/RFI shields. For example, the present invention is equally applicable to ornamental metallized polymer products, food packaging, utensils, decorative display pieces or the like.

Figure 1:
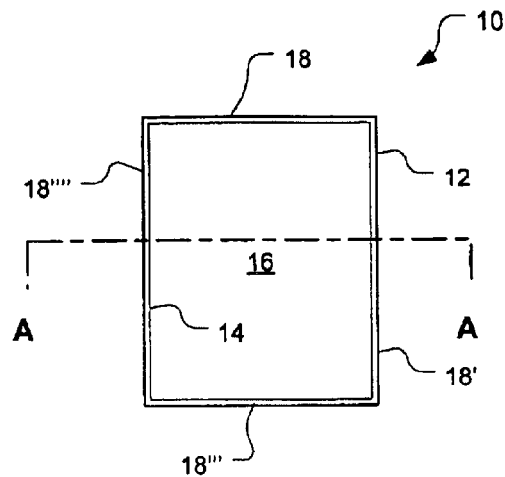
FIG. 1 is a top view of a thermoformed EMI/RFI shield.
Figure 1A:
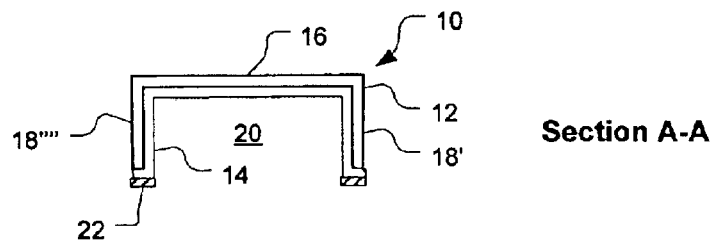
FIG. 1A is a cross-sectional view of the EMI/RFI shield of FIG. 1 along line A—A.

FIGS. 1 and 1A illustrate one embodiment of a shaped, metallized product that is encompassed by the present invention. The illustrated product is in the form of an EMI/RFI shield 10 for an electronic device, such as a cellular telephone. The EMI shield 10 is typically comprised of a shell 12 coated with at least one substantially even layer of a conductive material 14. In the illustrated embodiment, conductive layer 14 is along an inner surface of shell 12 but the conductive layer 14 may be on an outer surface of shell 12 or on at least a portion of both the inner and outer surface of shell 12.

The illustrated example of shell 12 in FIGS. 1 and 1A is a thermoform single compartment "can" that comprises an upper surface 16 and a plurality of sidewalls 18, 18', 18", 18'" that extend at an angle of approximately 90 degrees from upper surface 16 to define a chamber 20. It should be appreciated however, that the angle between the upper surface and sidewalls may vary depending on the use of the EMI/RFI shield. In use, a bottom edge of conductive layer 14 along sidewalls 18, 18', 18", 18'" may be grounded so as to create a grounded shield for an EMI source (not shown). To improve grounding, an optional gasket 22 may be coupled to the bottom edge of the sidewalls 18, 18', 18", 18'" and conductive layer 14.

Figure 2:
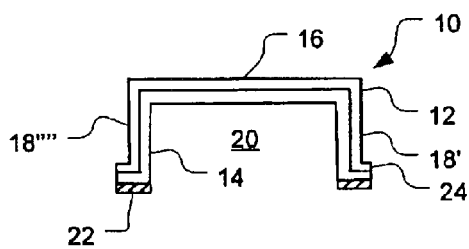
FIG. 2 is a cross-sectional view of an alternative EMI/RFI shield that has a lip.

As can be appreciated, the illustrated EMI/RFI shield 10 of FIGS. 1 and 1A are merely examples, and the EMI/RFI shield may take on a variety of different shapes and may be composed of a variety of materials. For example, FIG. 2 illustrates an EMI/RFI shield 10 that has a flange or lip 24 formed around the periphery of the bottom edge of sidewalls 18, 18', 18", 18'" that extends at an angle from the sidewalls so as to provide an enlarged surface area for contacting another body, such as a ground trace on a printed circuit board (not shown). Lip 24 is typically at an angle of approximately 90 degrees from the sidewalls so that the upper surface 16 and lip 24 are in substantially parallel planes, but the angle may be at a larger or smaller angle, depending on the particular application of the EMI/RFI shield. If desired, an electrically conductive or electrically insulative gasket 22 may be attached to an upper or lower surface of lip 24.

While not illustrated, EMI/RFI shield 10 may be dome shaped, or may have multiple chambers 20. A more complete description of some examples of EMI/RFI shields that may be manufactured with the methods of the present invention are described in commonly owned U.S. Pat. No. 5,811,050, U.S. Ser. No. 09/788,263, filed Feb. 16, 2001, and U.S. Ser. No. 09/684,188, filed Oct. 10, 2000, the complete disclosures of which are incorporated herein by reference.

Figure 3:
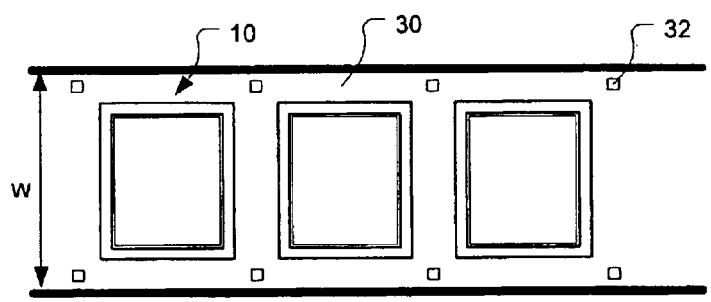
FIG. 3 is a top view of a plurality of a single compartment EMI/RFI shields on a tape sheet.
Figure 4:
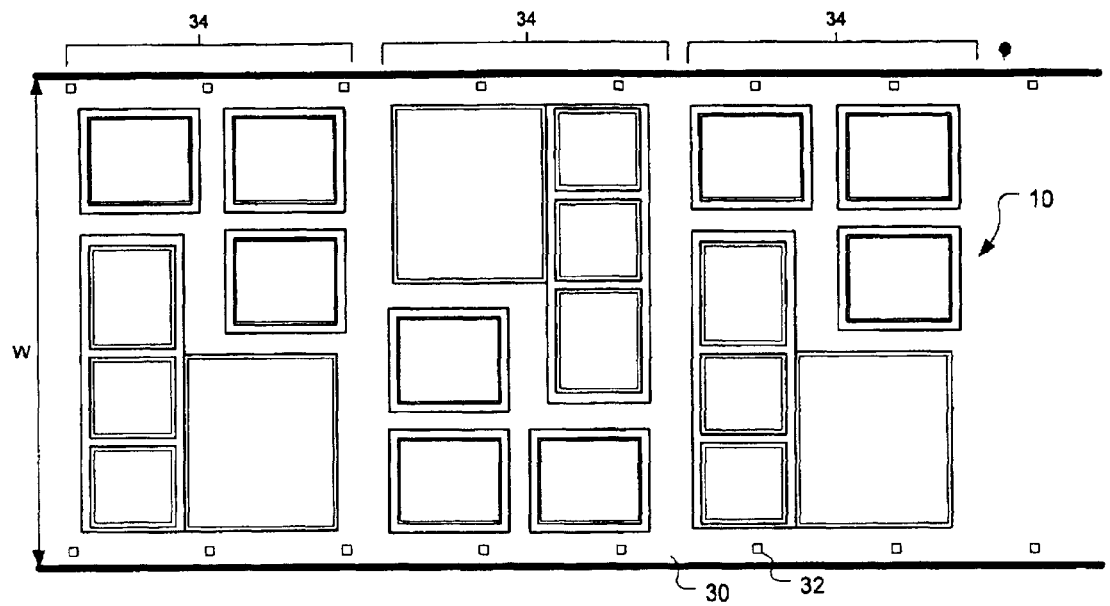
FIG. 4 is a top view of a plurality of multi-compartmentalized and single compartment EMI/RFI shields on a tape sheet.

Referring now to FIGS. 3 and 4, the present invention further provides an EMI/RFI shield 10 that is coupled to a tape or sheet 30. Sheet 30 may include openings 32 that are sized and spaced to interact with a transportation assembly (not shown) so as to allow sheet 30 to be moved through an in-line processing system. EMI/RFI shield 10 may be coupled to sheet 30 via an adhesive, but EMI/RFI shield 10 is preferably formed from the same material as sheet 30 and integrally attached to sheet 30.

As shown in FIG. 3, the sheet may be sized so as to allow only a single EMI/RFI shield 10 to be formed along the width W of the sheet. As shown in FIG. 4, however, sheet 30 may take on a larger width W such that a plurality of EMI/RFI shields 10 may be formed along width W of the sheet 30. EMI/RFI shields 10 formed along the width W of sheet 30 may have a single compartment, multiple compartments, and/or may have different sizes and shapes from other shields on sheet 30. For example, as shown in FIG. 4, the collection of different sized EMI/RFI shields in each section 34 of the sheet may be a complete set of EMI/RFI shields for a single printed circuit board or electronic device.

Figure 5:
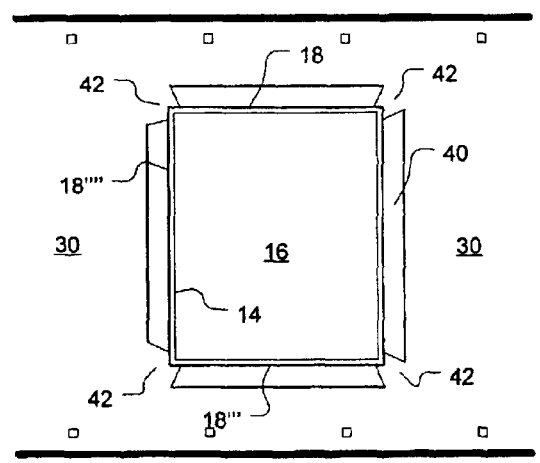
FIG. 5 is a top view of an EMI/RFI shield integrally attached to a sheet with tabs of material.

FIG. 5 is an enlarged top view of one EMI/RFI shield 10 in sheet 30 that illustrates one example of an integral connection between EMI/RFI shield 10 and the sheet 30. The cutting station may remove a portion of material around the periphery such that openings 40 are spaced around the edge of the EMI/RFI shield. 10. Each individual EMI/RFI shield 10 may be held onto sheet 30 with small tabs of material 42 along one or more edges or corners of the EMI/RFI shield 10.

Figure 5A:
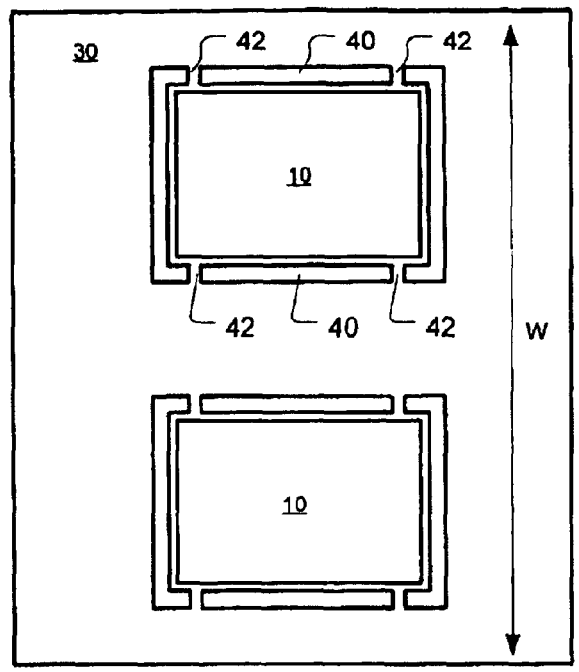
FIG. 5A is a top view of another EMI/RFI shield integrally attached to the sheet with tabs of material.
Figure 5B:
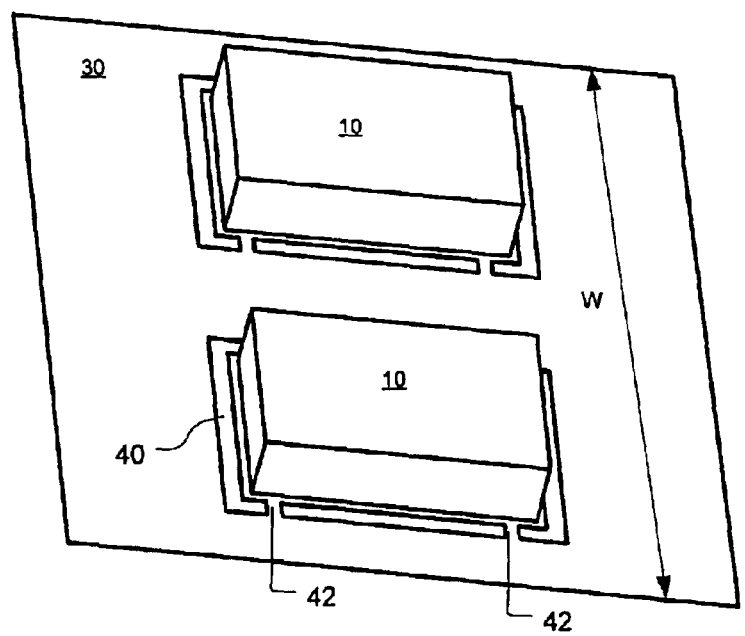
FIG. 5B is a perspective view of the EMI/RFI shield of FIG. 5A.

FIGS. 5A and 5B illustrate another embodiment of EMI/RFI shield 10 integrated into sheet 30. In the illustrated embodiments, the sheet has a width W that allows two shields to be positioned across width W. A cutting station may remove a portion of the material around the periphery such that openings 40 are spaced around tabs of material 42 that are positioned along the at least two sides of the EMI/RFI shield 10. In the illustrated embodiment, the tabs of material 42 are positioned along opposite sides or edges of the EMI/RFI shield 10.

The small tabs or pieces of material 42, are of a size and shape that are sufficient to substantially hold the EMI/RFI shield 10 in place within sheet 30. The shapes of the tabs 42 are typically kept simple and generally are square or rectangular in nature. The width of the tabs would most likely be kept under 1 inch and most likely less than one half of an inch so that the tabs 42 could easily be manually clipped by an operator with a small pair of cutters or scissors. Of course the tabs could be cut automatically, further down the line of the processing equipment with second cutting station, if desired.

The preferred number of tabs 42 per EMI/RFI shield 10 generally depends on the size of the part being manufactured. Consequently, a long part would have more tabs than a shorter part. The number of tabs should be sufficient to support the weight of the shield during the various stages of transportation along the in-line equipment so that the shield does not rotate or flex drastically away from the horizontal plane of the web or sheet during processing or transportation.

Some alternative features that may be incorporated into the tab 42 design is perforations (not shown). In such cases, the tab 42 may be perforated along the edge of the tab that connects to the flange 24 or edge of the shield 10 to the sheet 30. The perforations would still allow enough of a mechanical connection to support the weight of the EMI/RFI shield 10 but perforated enough to easily separate the shield 10 from the sheet 30 by tearing the perforated connection by hand, if necessary.

Figure 5C:
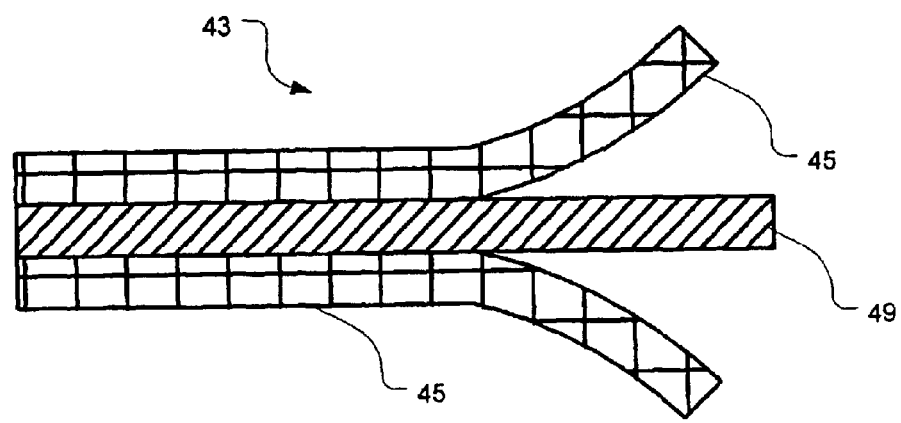
FIG. 5C illustrates an adhesive having removable liners that may be applied with a gasketing station of the present invention.

As can be appreciated, instead of integrally attaching (e.g., forming the EMI/RFI shield from the sheet 30 and keeping the EMI/RFI shield attached to the sheet 30 via integral tabs of material 42) the shield 10 may be cut away from the sheet 30 and using an adhesive, the shield 10 may be attached to the sheet. In such embodiments, as shown in FIGS. 2 and 5C, a bottom of the shield (e.g., bottom of flange 24 area (FIG. 2) that would contact a PCB) may be covered with a sheet of double sided adhesive 39. An adhesive 49 would adhere to the bottom of the plastic sheet 30 and have a release liner 45 on the opposite/outside surface to protect the adhesive 49, and the liner 45 would be removed prior to placing the EMI/RFI shield onto the PCB or other area of the electronic device. The cutting tools may be configured so that the product could be cut all the way through the plastic sheet but would leave the adhesive liner 45 intact so that the adhesive 49 would span both the sheet and the part 10, holding them intact until a secondary cutting phase fully removes the part from the sheet.

Figure 5D:
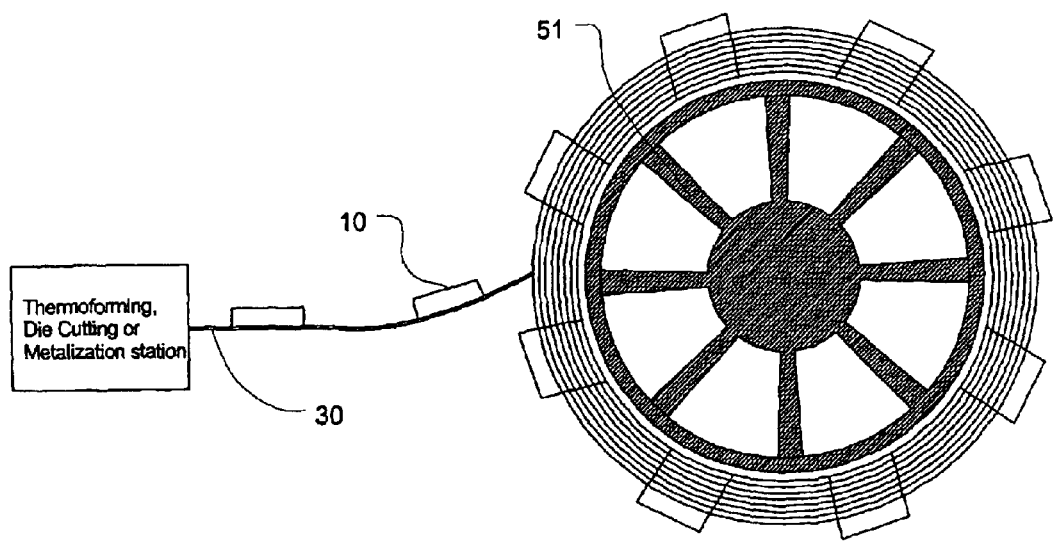
FIG. 5D schematically illustrates a spool comprising a sheet of material with the EMI/RFI shields attached thereto.

FIG. 5D illustrates a reel or spool 51 that is configured to receive sheet 30 and the integrally attached EMI/RFI shields 10. Spool may be transported from one processing station to another processing station wherein the spool 51, EMI/RFI shields 10, and sheet 30 may feed into the in-line equipment to remove the EMI/RFI shields 10 from sheet 30 and place it onto a printed circuit board or electronic device.

Figure 6:
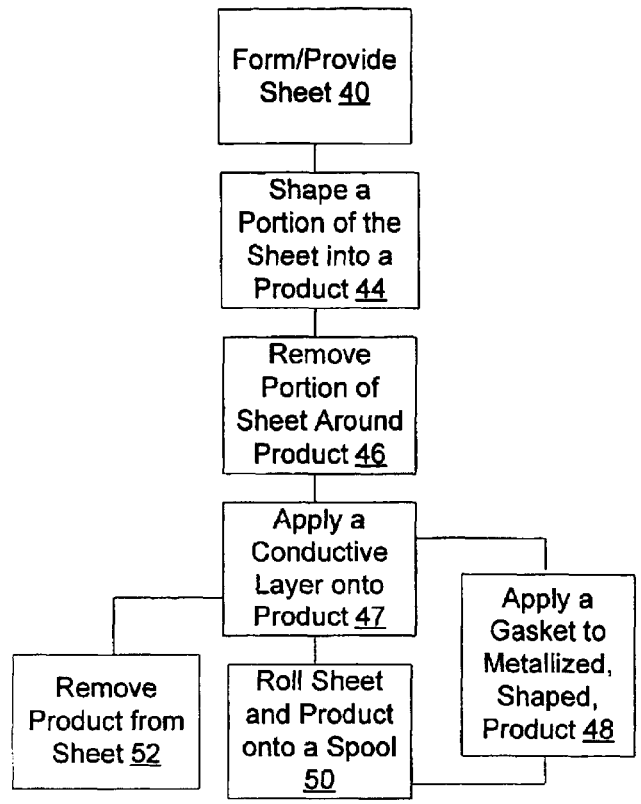
FIG. 6 is a schematic illustration of one method of the present invention.
Figure 7:
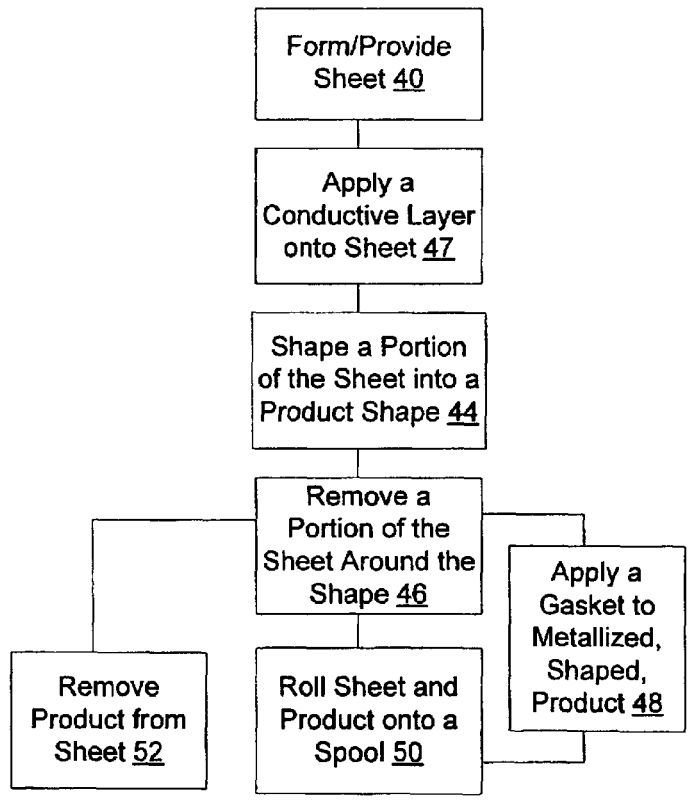
FIG. 7 is a schematic illustration of an alternative method of the present invention.

FIGS. 6 and 7 schematically illustrate two exemplary in-line equipment and methods that are encompassed by the present invention. While the in-line equipment and methods described herein are preferably carried out using a transportation assembly (not shown) to move the sheet between a plurality of individual processing stations in a continuous, in-line processing system, it should be appreciated that the steps described herein do not have to be performed continuously and the steps may be carried out non-continuously. For example, if desired, after the sheet is processed at one or more processing stations, the sheet may be rolled up onto a reel or spool 51 (FIG. 5D) and moved to a station(s) in a different processing system.

Referring now to FIG. 6, at a first station 41 a sheet material is provided. In one embodiment, a material, typically in the form of "pellets" or recovered virgin or used material, including material that may already contain metallized particles or layers (such as carbon, ferrites, metallized glass fibers, metallized fibers and nano-particles), may be reground and extruded into a film sheet of a desired size and width. In other embodiments, a pre-manufactured extruded sheet may be unspooled and fed into the in-line equipment.

The material used in the formable sheet may be PVC, ABS, polyester, polypropylene, polycarbonate, PBT (Polybutylene Terephthalate) or any other formable polymer-based material. The extruded, formable sheet 30 (FIGS. 3 and 4) typically has a width between approximately 1 inch and approximately 8 inches, but it may be larger, such as up to approximately 30 inches or approximately 35 inches. Sheet 30 may have a thickness between approximately 0.005" inches and approximately 0.040" inches, but may be larger or smaller as desired. As can be appreciated, the present invention may use any sheet of any width and thickness, and the present invention should not be limited to the recited widths and thicknesses.

Thereafter, the continuous sheet 30 may be directed to a shaping station 44 with a transportation assembly where the sheet is shaped to form a desired shape for the product, such as shell 12 (FIGS. 1 and 2). Optionally, the shaping station may have a pre-heat stage (not shown) so as to bring the continuous sheet 30 up to a predetermined or recommended processing temperature suitable for forming the plastic sheet 30. Typically, the product is formed by thermoforming, but it may also be formed by pressure forming, or the like. As is known in the art, the thermoforming process generally provides a flat plastic sheet that is heated to a processing temperature and brought into contact with a forming mold. The air is subsequently evacuated from underneath the vacuum mold which forces the sheet against the mold by vacuum pressure from below and atmospheric pressure from above. Because the sheet is softened enough it will conform to the dimensions of the mold.

Once thermoformed (or otherwise shaped), the sheet and shaped product are optionally moved onto a cutting station 46, where the sheet and product may be subjected to a first die cut operation where the major elements of the product are partially separated from the remaining sheet material (scrim). For example, a number of small "tabs" of material may be left between the sheet 30 and the shell 12 which act to keep the shell 12 attached to the sheet material 30.

After the product is die cut, the shaped product (which is still attached to the sheet 30) is moved to a metallization station 47 where a conductive layer is applied to the shaped product. The conductive layer may be applied through any one of numerous methods, including but not limited to, vacuum metallization, printing with conductive ink, electroplating, electroless plating, conductive painting, or the like. Vacuum metallization is one preferred method due to uniformity of deposition along the edges and surfaces of the sheet. The conductive layer may comprise aluminum, nickel, tin, copper, silver, zinc, or any other conductive material, including conductive paint, electroplated tin, zinc or the like.

While not explicitly illustrated, the metallization station 47 may include a plurality of individual metallization stations for applying one or more conductive layers onto one or more surfaces of the sheet. For example, a first metallization station may apply a first conductive layer, such as nickel. Thereafter, the metallized sheet may be moved to a second metallization station where a second conductive layer, such as tin or nickel, is added. As can be appreciated, additional conductive or non-conductive layers may be disposed between the first and second conductive layers, if desired.

The first and second metallization stations may or may not utilize the same type of deposition assemblies. For example, the first metallization station may use vacuum deposition, while the second metallization station may use electroplating. As can be appreciated, any number of metallization stations and any combination of metallization technologies may be used in the metallization stations of the present invention.

After metallization, the metallized, shaped shell may optionally be moved to a gasketing station 48 where an electrically conductive or electrically insulated adhesive can be added to the metallized, shaped product in selected areas to create a ready-to-assemble product, such as an EMI/RFI shield 10. The equipment used to apply the gasket can take several forms. For example, one gasket material type used is the double sided (conductive or non-conductive) tape adhesive 43 illustrated in FIG. 5C. The types of adhesives would generally have the adhesive material 49 sandwiched between two different release liners 45 and be applied in a similar style to laminating where one of the release liners would be removed exposing the adhesive 49. The adhesive 49 could then be unspooled from a roll and applied to the plastic sheet 30 as the sheet is being transferred from station to station. The remaining release liner would remain intact to protect the adhesive 49 until it is removed, most likely during final assembly.

In most cases, the width of the adhesive 49 would only be wide enough to completely cover the width of the part or parts in the sheet to reduce the amount of waste generated, but if desired the adhesive could have a width that is substantially equal to the width of the sheet. In other cases, it may be desirable to have the adhesive 49 precut to a specific shape so that the adhesive will align with the different edges or flanges of the shield that will be making contact with the PCB, such as in the case of a compartmentalized shield. The adhesive could still be applied in a laminating style in this case, however, adhesive would only be applied to select areas of the plastic and not across the width of the part.

Alternatively, gasketing station 48 may dispense a liquid conductive or non-conductive adhesive. Dispensable adhesives are generally contained in a syringe type applicator and droplets or continuous beads of adhesive are able to be placed either manually or robotically in select locations of the sheet. The syringes are typically pneumatically controlled so that a consistent sized droplet or bead is place every time. Most adhesives of this type require some length of cure time either at ambient or elevated temperatures. These types of adhesives are generally less expensive because there is very little waste, if any.

After the optional gasketing station, the sheet 30 with the attached products may be wound-up on spool or reel at a spooling station 50 for shipment to a manufacturer for final assembly. Once unspooled, automated machines may remove the remove the metallized, shaped product after the final die cut and apply the products onto its final form. For EMI/RFI shields, the EMI/RFI shield may be removed from the sheet and placed onto a printed circuit board (PCB) in an appropriate location.

After the spooling station 50 or instead of going to the spooling station, the sheet may be moved to a second cutting station 52 where the cutting station may remove the products from the sheet (e.g., cut through tabs 42) and apply the shaped, metallized product in its appropriate location, such as a printed circuit board of an electronic device.

FIG. 7 illustrates an alternative configuration for the in-line equipment and associated methods. In the alternative configuration, instead of first thermoforming (or otherwise shaping) the sheet, one or more conductive layers may first be applied to the sheet at a metallization station 47. Thereafter, the metallized sheet may be moved to a shaping station 44 wherein the product shape is formed in the metallized sheet. The metallized, shaped product may then be moved to the cutting station 46 where a portion of the material around a periphery of the metallized, shaped product is removed, such that the shaped, metallized product is still retained on the sheet. Finally, the sheet and metallized, shaped product may be moved to a cutting station 52 to remove the product from the sheet or the sheet may be moved to a spooling station 50 where the sheet and metallized, shaped product is wound up on a spool.

Similar to the embodiment of FIG. 6, a gasket may optionally be applied to the metallized, shaped product at a gasketing station 48. Thereafter, the sheet and metallized, shaped product (with gasket) may be moved to a spooling station 50, where the sheet and metallized, shaped product is wound up on a spool. Alternatively, the sheet 30 may be moved to a second cutting station 52 to remove the EMI/RFI shields 10 from the sheet.

As can be appreciated, the methods and in-line equipment of FIGS. 6 and 7 are merely examples and various modifications can be made without departing from the essence of the present invention. For example, other processing stations may be interspersed between the recited stations. Other stations include, but are not limited to, printing or decoration stations for applying information or logos, ultrasonic welding stations for inserting threaded features for receiving screws or for inserting grommet features to be used as grounding eyelets where screws, rivets, or the like can be inserted to make an electrical connection between the shield and the PCB or chassis the shield is being inserted into or attached. Moreover, other configurations of the stations may be used. For example, in further embodiments, it may be desirable to shape the sheet, apply the one or more conductive layers to the sheet, and thereafter remove a portion of material around the periphery of the shaped, metallized product. In yet other embodiments, it may be desirable to not remove material from around the periphery of the EMI/RFI shield, and only remove material from around the EMI/RFI shield at the final step before placing the EMI/RFI shield.

EXAMPLES OF PROCESSING STATIONS

Figure 8:
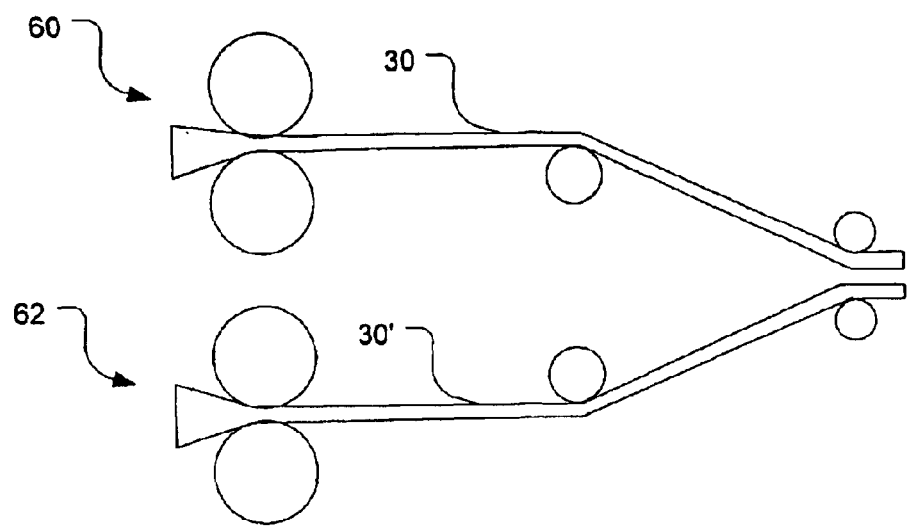
FIG. 8 schematically illustrates one example of a forming station that has a first and second extruder.
Figure 9:
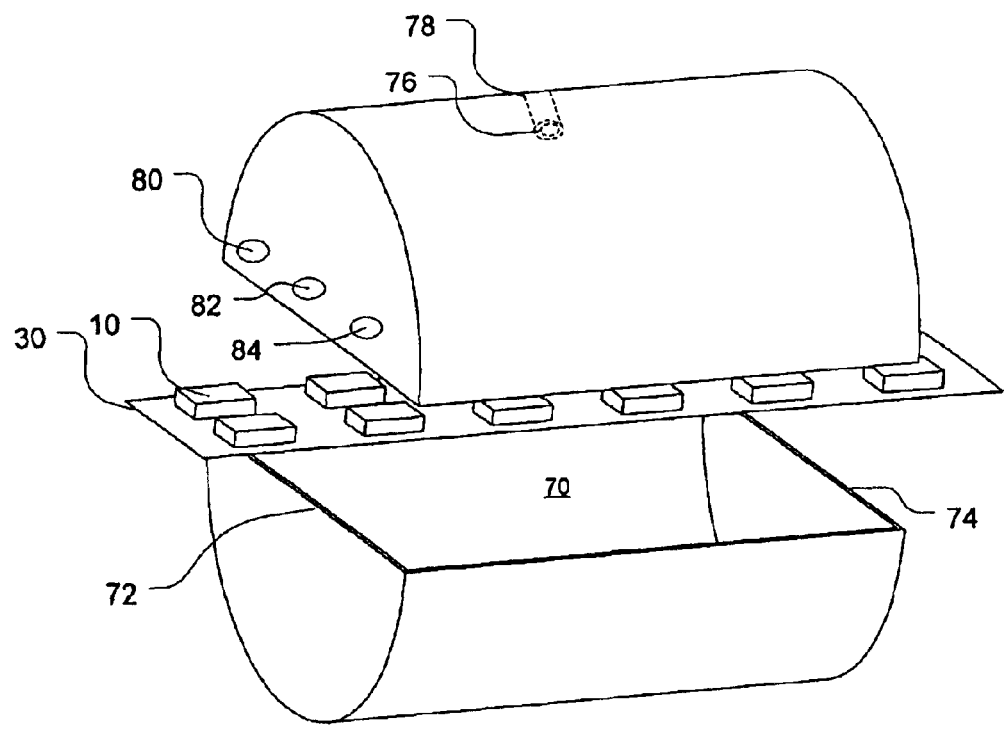
FIG. 9 schematically illustrates one example of a metallization station.

FIGS. 8 to 9 schematically illustrate some examples of some processing stations that may be used with the present invention. It should be appreciated that the following description are merely examples, and various other conventional and proprietary technology may be used without departing from the scope of the present invention.

FIG. 8 illustrates an exemplary extruder station that may be used to extrude a material substrate into the sheet 30. A first extruder 60 has the ability to accept nominal room temperature material and then heat the material to the point of melting before injecting the material onto a platen for spreading into the film sheet. In the present invention, the width of the platen (that determines the width of the formed sheet) is typically on the order of approximately 1 inch to approximately 8 inches, but may be larger or smaller if desired. Extruder 60 would be capable of accepting material that contained previously metallized film. This would allow for recycling of EMI shield products previously used in an electronic product.

As shown in FIG. 8, the station may include a second, stacked extruder 62 that would allow for two film substrates to be produced in an adjacent (e.g., vertical) conjunction with each other. The first and second extruders 60, 62 would create sheets 30, 30' separate from each other until after a metallization layer is applied to one or both interior or exterior surfaces of the sheet. The sheets may then be brought together to form a layered EMI shield product. For example, with a first and second film 30, 30', flexible circuitry could be inserted and encapsulated into a single integrated part, using an insertion station (not shown).

FIG. 9 illustrates one example of a metallization station that applies a metal layer onto at least one surface of the sheet and/or shaped product in a moveable vacuum chamber. As noted above, however, metallization can take place by several methods and the present invention is not limited to vacuum metallization. Vacuum metallization equipment would comprise a small vacuum chamber 70 that would contain various internal chambers so a metal material could be accepted, metallized, and discharged via one end. The construction of the vacuum chamber is typically such as to allow the continuous processing of the sheet 30 and/or EMI/RFI shield product 10. The vacuum chamber 70 could be located on the same plane as the other in-line processing stations, or it could be placed on another plane, if desired. Such a chamber, include ports 72, 74 for entry and exit of the sheet 30 into the vacuum chamber 70. The ports are designed to open and close so as to create a pneumatic seal (sufficient for creating a vacuum). In a typical application, tungsten (or similar material) filaments 76 with an embedded cane material 78 (such as aluminum) would be inserted into the vacuum chamber 70. One vacuum port 80 could support each single chamber and multiple ports could be used to insert new filaments/canes for the metallization process. Additional ports 82, 84 could be used to insert gases (like Nitrogen) in order to perform a "glow discharge" process step just prior to metallization. Typically metallization station will use a smaller pressure containment vessel that could be evacuated to low pressures ($\sim 10^{-6}$ torr.) in a very short period of time (<3 sec.)

While particular forms of the invention have been illustrated and described, it will be apparent that various modifications can be made without departing from the spirit and scope of the invention.

What is claimed is:

1. An assembly comprising an EMI/RFI shield integrally formed in a thermoformable sheet, wherein portions of the thermoformable sheet are removed around a periphery of the EMI/RFI shield such that the portions of the thermoformable sheet that are not removed integrally connect the EMI/RFI shield to a remainder of the thermoformable sheet.

2. The assembly of claim 1 wherein the EMI/RFI shield comprises at least one layer of a conductive material.

3. The assembly of claim 2 wherein the EMI/RFI shield is multi-compartmentalized.

4. The assembly of claim 2 wherein the EMI/RFI shield defines a single compartment.

5. The assembly of claim 2 wherein the layer of conductive material comprises at least one layer of tin, aluminum, copper, and nickel.

6. The assembly of claim 5 wherein the conductive material comprises a vacuum metallized first layer of tin and an electroplated second layer of tin.

7. The assembly of claim 1 wherein the thermoformable sheet comprises a recycled, conductively coated polymer EMI/RFI shield that has been mechanically disintegrated and then recombined back into the formable polymer sheet.

8. The assembly of claim 7 where the mechanically disintegrated EMI/RFI shields comprise a metallized film comprising one of a painted film, a vacuum metallized film, and an electroless plated film.

9. The assembly of 1 wherein the EMI/RFI shield comprises a top surface, a plurality of sidewalls extending at an angle from the top surface and a flange around a periphery of the side walls, wherein the flange and the top surface define substantially parallel planes.

10. A reel of material for in-line processing equipment, the reel comprising:
    a sheet of substantially planar material;
    a spool that receives the sheet of substantially planar material; and
    a plurality of non-planar EMI/RFI shields integrally formed with the sheet of substantially planar material and removably attached to the sheet of substantially planar material that is rolled on the spool.

11. The reel of material of claim 10 wherein the EMI/RFI shields are attached to the sheet of material with tabs of material.

12. The reel of material of claim 10 wherein the EMI/RFI shields comprise at least one layer of conductive material.

13. The reel of material of claim 10 wherein the EMI/RFI shields and sheet of material comprise recycled material.

14. A method for forming an EMI/RFI shield integrally attached to a formable polymer sheet, the method comprising:
    shaping the formable polymer sheet to create at least one EMI/RFI shield;
    applying a conductive layer to the formable polymer sheet; and
    removing a portion of the material around a periphery of the conductive EMI/RFI shield so as to leave the EMI/RFI shield integrally attached to a remainder of the formable polymer sheet.

15. The method of claim 14 wherein the shaping is carried out before the applying the conductive layer.

16. The method of claim 14 wherein the shaping is carried out after applying the conductive layer.

17. The method of claim 14 further comprising applying a gasket to the EMI/RFI shield.

18. The method of claim 14 comprising forming the polymer sheet from recycled material that comprises conductive material.

19. The method of claim 14 wherein removing a portion comprises leaving tabs of material that integrally connect the EMI/RFI shield to the formable polymer sheet.

20. The EMI/RFI shield of claim 5 wherein the conductive material comprises a vacuum metallized first layer of tin and an electroplated second layer of nickel.

21. The reel of material of claim 11 wherein the tabs of material are perforated.

22. The assembly of claim 1 wherein the thermoformable sheet comprises a conductive polymer.

23. A sheet comprising;
    a polymer sheet comprising an opening;
    an EMI/RFI shield disposed within the opening such that there is a spacing between a periphery of the EMI/RFI shield and the polymer sheet;
    a plurality of tabs spaced around at least a portion of the periphery of the EMI/RFI shield to connect the EMI/RFI shield to the polymer sheet.

24. The sheet of claim 23 wherein the EMI/RFI shield extends above a plane defined by a top surface of the polymer sheet.

25. The sheet of claim 23 wherein the EMI/RFI shield comprises side walls that extend at an angle from the plane defined by the top surface of the polymer sheet.

26. The sheet of claim 25 wherein the EMI/RFI shield comprises a flange that is coupled to the side walls, the flange extending in a plane that is substantially parallel to the plane defined by the top surface of the polymer sheet.

27. The sheet of claim 23 wherein the EMI/RFI shield comprises a conductive layer disposed on at least one surface.

28. The sheet of claim 23 wherein the polymer sheet is conductive.

\* \* \* \* \*